(12) United States Patent
Itou et al.

(10) Patent No.: US 10,923,357 B2
(45) Date of Patent: Feb. 16, 2021

(54) ELEMENT CHIP AND MANUFACTURING PROCESS THEREOF

(71) Applicant: Panasonic Intellectual Property Management Co., Ltd., Osaka (JP)

(72) Inventors: Akihiro Itou, Kyoto (JP); Atsushi Harikai, Osaka (JP); Noriyuki Matsubara, Osaka (JP); Shogo Okita, Hyogo (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 153 days.

(21) Appl. No.: 15/899,422

(22) Filed: Feb. 20, 2018

(65) Prior Publication Data

US 2018/0240678 A1    Aug. 23, 2018

(30) Foreign Application Priority Data

Feb. 23, 2017    (JP) .............................. JP2017-032601

(51) Int. Cl.
  *H01L 21/3065*    (2006.01)
  *H01J 37/32*    (2006.01)
  (Continued)

(52) U.S. Cl.
  CPC .. *H01L 21/30655* (2013.01); *H01J 37/32009* (2013.01); *H01J 37/3244* (2013.01);
  (Continued)

(58) Field of Classification Search
  CPC ......... H01L 21/30655; H01L 21/68742; H01L 21/6835; H01L 21/7806; H01L 21/78;
  (Continued)

(56) References Cited

U.S. PATENT DOCUMENTS

2004/0171254 A1* 9/2004 Iijima ................. H01L 21/3065
                                                      438/689
2008/0272466 A1* 11/2008 Lake ................. H01L 21/30655
                                                      257/621
(Continued)

FOREIGN PATENT DOCUMENTS

| JP | 2014-513868 A | 6/2014 |
| JP | 2016-146395 A | 8/2016 |
| WO | 2012/125560 A2 | 9/2012 |

OTHER PUBLICATIONS

Japanese Office Action issued in Japanese Patent Application No. JP2017-032601 dated Dec. 18, 2018.

*Primary Examiner* — Mouloucoulaye Inoussa (74) *Attorney, Agent, or Firm* — Pearne & Gordon LLP (57) ABSTRACT

Provided is a manufacturing process of an element chip, which comprises a preparation step, a setting step for setting the substrate on a stage, and a plasma-dicing step for dividing the substrate into a plurality of element chips, wherein the plasma-dicing step is achieved by repeatedly implementing etching routines each including an etching step for etching the second layer along the street regions to form a plurality of grooves and a depositing step for depositing a protective film on inner walls of the grooves, wherein the plasma-dicing step includes a first etching step for forming the grooves each having a first scallop on the inner wall thereof at a first pitch, and a second etching step for forming the grooves each having a second scallop on the inner wall thereof at a second pitch, and wherein the second pitch is greater than the first pitch.

12 Claims, 8 Drawing Sheets

(51) Int. Cl.
*H01L 21/687* (2006.01)
*H01L 21/683* (2006.01)
*H01L 21/78* (2006.01)
*H01L 21/311* (2006.01)
*H01L 21/67* (2006.01)

(52) U.S. Cl.
CPC .. *H01J 37/32743* (2013.01); *H01L 21/31138* (2013.01); *H01L 21/6835* (2013.01); *H01L 21/68735* (2013.01); *H01L 21/68742* (2013.01); *H01L 21/68785* (2013.01); *H01L 21/78* (2013.01); *H01L 21/7806* (2013.01); *H01L 21/67109* (2013.01); *H01L 2221/68327* (2013.01)

(58) Field of Classification Search
CPC ......... H01L 21/31138; H01L 21/68785; H01L 23/544; H01L 21/784; H01L 25/0655; H01L 25/18; H01L 21/31144; H01L 29/06; H01L 21/3065; H01L 33/20; H01J 37/32743; H01J 37/3244

USPC .................. 438/462–463; 257/620, E21.001, 257/E21.218, E21.231, E21.599, E23.179
See application file for complete search history.

(56) References Cited

U.S. PATENT DOCUMENTS

| | | | |
|---|---|---|---|
| 2009/0057838 A1* | 3/2009 | Arita | H01L 21/31138 257/618 |
| 2011/0177675 A1* | 7/2011 | Grivna | H01L 21/30655 438/462 |
| 2014/0045338 A1* | 2/2014 | Tohnoe | H01L 21/3086 438/719 |
| 2014/0312468 A1* | 10/2014 | Chen | H01L 21/76898 257/621 |
| 2016/0233111 A1 | 8/2016 | Shiota et al. | |
| 2016/0322306 A1 | 11/2016 | Roesner et al. | |

* cited by examiner

ELEMENT CHIP AND MANUFACTURING PROCESS THEREOF

CROSS REFERENCE TO RELATED APPLICATION

The present application is based on and claims priority under 35 U.S.C. § 119 with respect to the Japanese Patent Application No. 2017-032601 filed on Feb. 23, 2017 of which entire content is incorporated herein by reference into the present application.

TECHNICAL FIELD

The present invention relates to an element chip and a manufacturing process thereof, and in particular, to the manufacturing process of the element chip by plasma-dicing a substrate of a layered structure containing a semiconductor layer.

BACKGROUND

One of processes for dicing a substrate is known as a plasma-dicing process in which the substrate with a mask formed thereon is plasma-etched to divide it into a plurality of individual chips. For example, Patent Document 1 (JP 2014-513868 A or U.S. Pat. No. 8,802,545 B2) and Patent Document 2 (JP 2016-146395 A or U.S. Pat. No. 9,607,861 B2) disclose a so-called Bosch process which may be used for plasma-etching a semiconductor layer containing semiconductor such as silicon. The Bosch process is achieved by repeatedly implementing an etching step for plasma-etching the substrate along streets which defines a plurality of element regions with a fluorine-based gas plasma, and a depositing step for depositing a protective film with a fluorocarbon gas plasma, so that a plurality of deep grooves corresponding to the streets are formed step by step.

Figure 8:
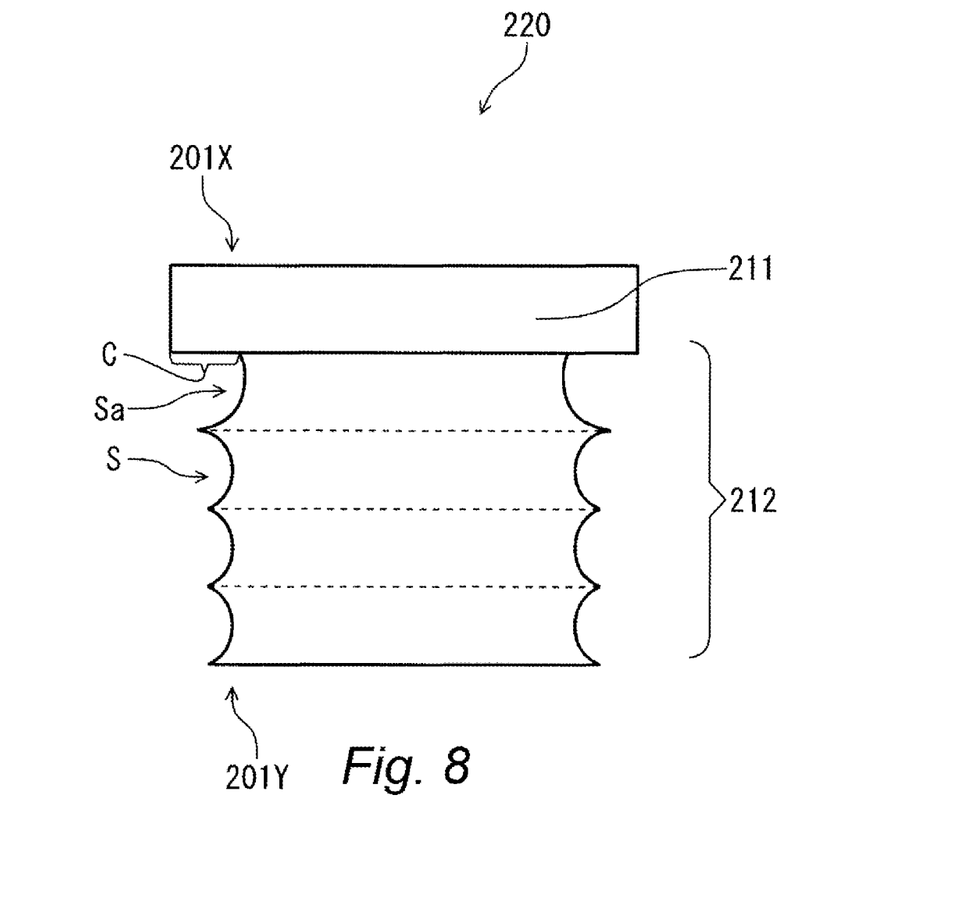
FIG. 8 is a schematic side view of the conventional element chip.

Since the Bosch process includes isotropic etching steps, a plurality of concavities and convexities (surface asperity) called as scallops are formed on inner walls of the grooves after being processed. Thus, the scallop S are formed on the periphery of the second layer 212 of the element chip 220 to be produced as shown in FIG. 8. When the substrate has a layered structure including the second layer 212 made of semiconductor and the first layer 211 of material other than semiconductor, an undercut C is likely formed at a boundary surface between the first layer 211 and the second layer 212. This is because the first etching step for etching the second layer 212 is performed before a deposition step for depositing the protective film, so that the scallop Sa is deeply formed or gouged immediately beneath the first layer 211. Thus, during the first etching step, since the second layer 212 is not protected by the protective film, the second layer 212 is likely be etched quickly in the horizontal direction as well as the vertical direction. On the other hand, since the first layer 211 contains materials other than semiconductors, during the first etching step, the first layer 211 is unlikely be etched quickly in the horizontal direction when compared with the second layer 212. The substantial undercut C is formed or gouged due to such a difference of the etching rates in the horizontal direction between the first layer 211 and the second layer 212. The undercut C may often cause the first layer 211 peeled off the second layer 212.

In the second and subsequent steps of the Bosch process, the second layer 212 is repeatedly etched on the bottom of the scallop Sa which was formed in the first etching step. Since the bottom of the scallop Sa is substantially gouged beyond the peripheral edge of the first layer 211 with the undercut C, the bottom of the scallops S that are formed subsequently after the scallop Sa are also substantially gouged beyond the peripheral edge of the first layer 211. As a result, the first or upper main side 201X of the element chip 220 to be produced has a size or area substantially greater than that of the second or bottom main side 201Y. This causes, after the dicing step, an erroneous recognition and a pick-up malfunction during a pick-up step for picking up the element chip 220, thereby deteriorating the production yield.

In order to minimize the undercut C, it may be possible to shorten the time period of each of the etching steps. However, this reduces the etched depth of the substrate in each of the etching steps and increases the cycle numbers (repeating times) of the etching steps required for dividing the substrate, which again deteriorate the production yield.

SUMMARY

The first aspect of the present invention relates to a manufacturing process of an element chip, which comprises a preparation step for preparing a substrate having first and second side and including a first layer and a second layer composed of a semiconductor layer closer to the second side than the first layer, the substrate further containing a plurality of street regions defining a plurality of element regions, a setting step for setting the substrate on a stage within a chamber of a plasma processing apparatus with the second side opposing to the stage, and a plasma-dicing step for dividing the substrate into a plurality of element chips each having the element region, by exposing the substrate to a plasma atmosphere generated within the chamber by applying a high frequency power to an electrode provided with the plasma processing apparatus, wherein the plasma-dicing step is achieved by repeatedly implementing etching routines each including an etching step for etching the second layer along the street regions to form a plurality of grooves and a depositing step for depositing a protective film on inner walls of the grooves, wherein the plasma-dicing step includes a first etching routine having a first etching step for etching the second layer along the street regions to form the grooves each having a first scallop on the inner wall thereof at a first pitch, and a second etching routine having a second etching step for etching the second layer along the street regions to form the grooves each having a second scallop on the inner wall thereof at a second pitch, and wherein the second pitch is greater than the first pitch.

The second aspect of the present invention relates to an element chip having first and second side, which comprises a first layer containing an element region, and a second layer composed of a semiconductor layer closer to the second side than the first layer, wherein the second layer includes a periphery having a plurality of scallops formed thereon, wherein the scallops include a first scallop formed at a first pitch and a second scallop formed at a second pitch and positioned closer to the second side than the first scallop, and wherein the second pitch is greater than the first pitch.

DETAILED DESCRIPTION

A manufacturing process of an element chip according to the present embodiment comprises a preparation step for preparing a substrate having first and second side and including a first layer and a second layer composed of a semiconductor layer closer to the second side than the first layer, the substrate further containing a plurality of street regions defining a plurality of element regions, a setting step for setting the substrate on a stage within a chamber of a plasma processing apparatus with the second side opposing to the stage, and a plasma-dicing step for dividing the substrate into a plurality of element chips each having the element region, by exposing the substrate to a plasma atmosphere generated within the chamber by applying a high frequency power to an electrode provided with the plasma processing apparatus. The plasma-dicing step is achieved by repeatedly implementing etching routines each including an etching step for etching the second layer along the street regions to form a plurality of grooves and a depositing step for depositing a protective film on inner walls of the grooves. The plasma-dicing step includes a first etching routine having a first etching step for etching the second layer along the street regions to form the grooves each having a first scallop on the inner wall thereof at a first pitch PT1, and a second etching routine having a second etching step for etching the second layer along the street regions to form the grooves each having a second scallop on the inner wall thereof at a second pitch PT2, in which the second pitch PT2 is greater than the first pitch PT1. The first, second and third etching routines having the first, second and third etching step for etching the second layer along the street regions to form the grooves, and no specific step is defined for etching the first layer.

In the plasma-dicing step, the etching step for etching the second layer along the street regions to form a plurality of the grooves and a depositing step for depositing the protective film on inner walls of the grooves are repeatedly implemented so as to form the scallops S along the inner walls of the grooves. According to the present embodiment, the etching conditions are varied to adjust the pitches PT of the scallops S. At the same time, the depth d of the scallops S is also varied along with the adjusted pitches PT. The first etching is made under a condition such that the pitch PT (i.e., the depth d thereof is) of the scallop S just beneath the first layer is reduced to suppress the undercut C. Then, the subsequent etching steps are made under a condition such that the pitch PT is substantial, upon considering the operation time required for production (production yield). With reference to drawings, the present embodiment will be described hereinafter.

First Embodiment

In the first embodiment, a substrate 1 is etched from a first main side of the substrate 1 through a second side thereof by first and second plasma-etching steps, thereby to individualize or divide the substrate into a plurality of element chips.

[Manufacturing Process of Element Chips]

Figures 1A, 1B:
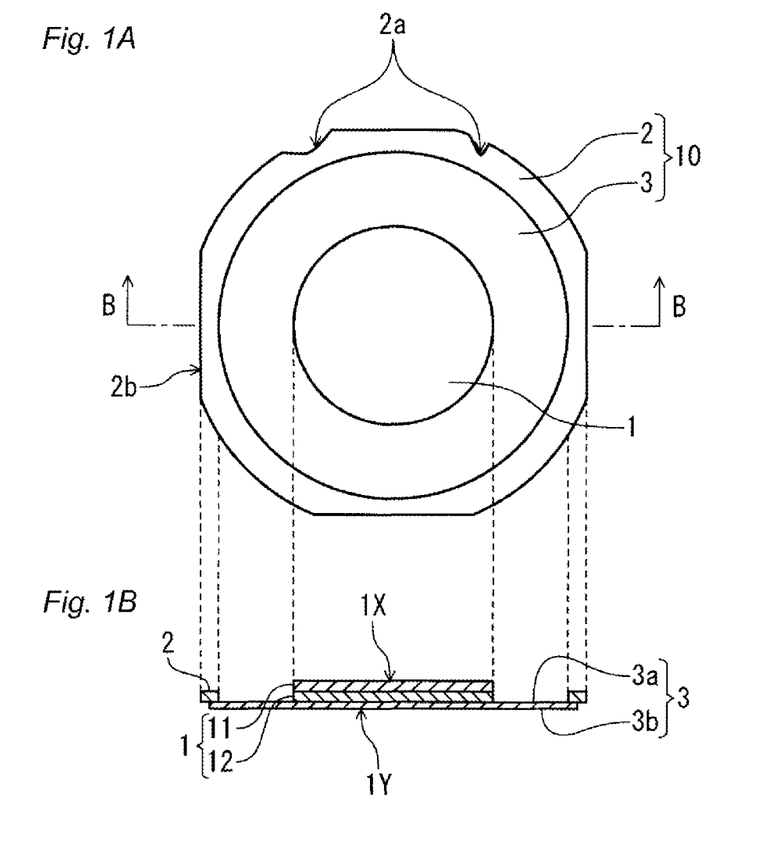
FIG. 1A is a top plan view schematically depicting a conveying carrier holding a substrate according to an embodiment of the present invention.
FIG. 1B is a cross-sectional view taken along a B-B line of FIG. 1A.
Figure 2:
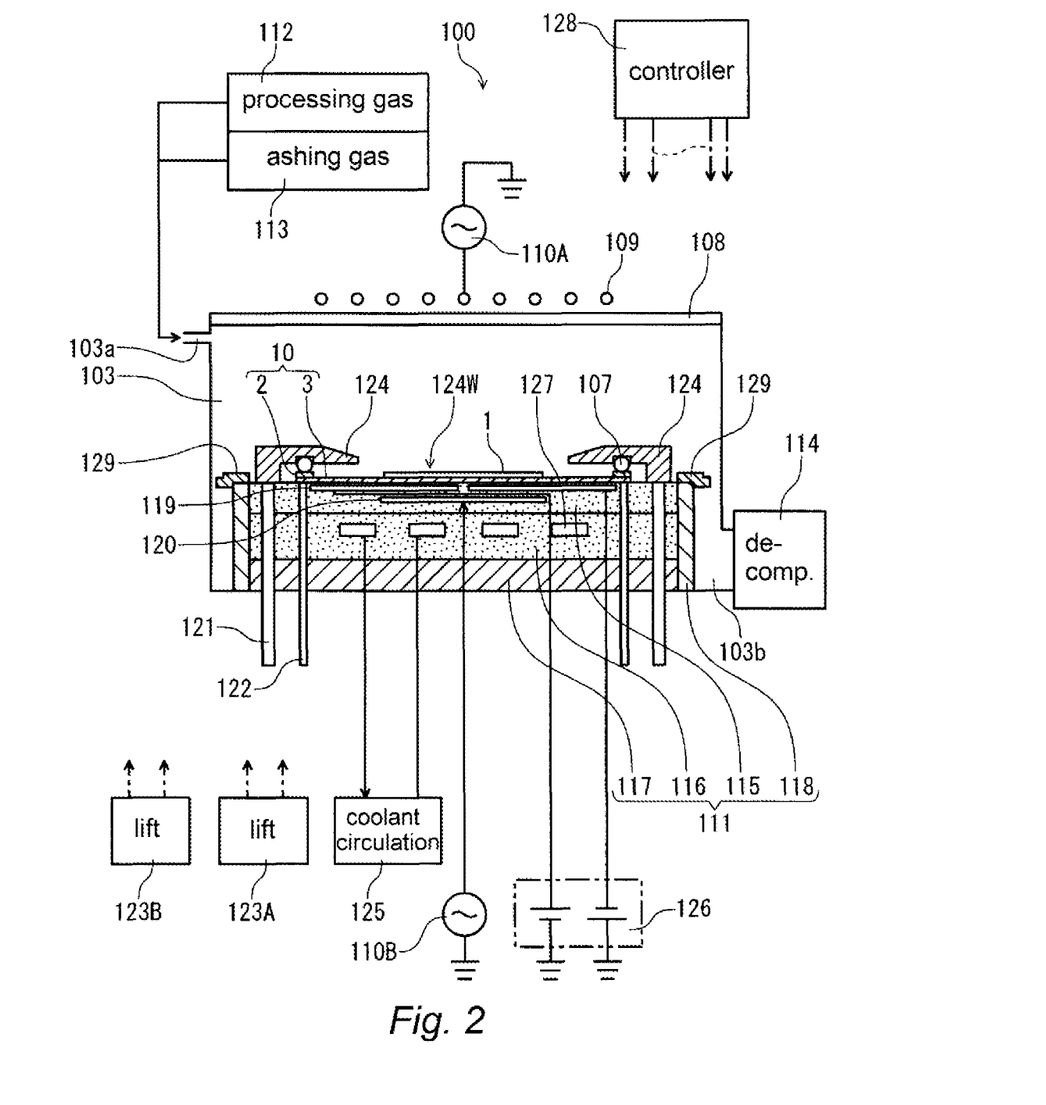
FIG. 2 is a conceptual cross-sectional view depicting a basic structure of a plasma processing apparatus according to the embodiment of the present invention.
Figure 3A:
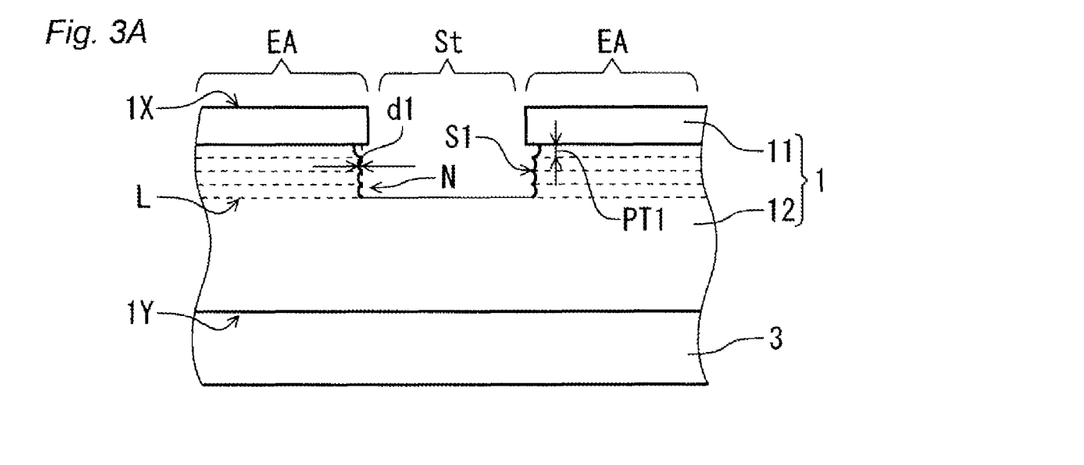
FIGS. 3A and 3B are side views of the substrate schematically depicting some core steps of the manufacturing method according to the embodiment of the present invention.
Figure 3B:
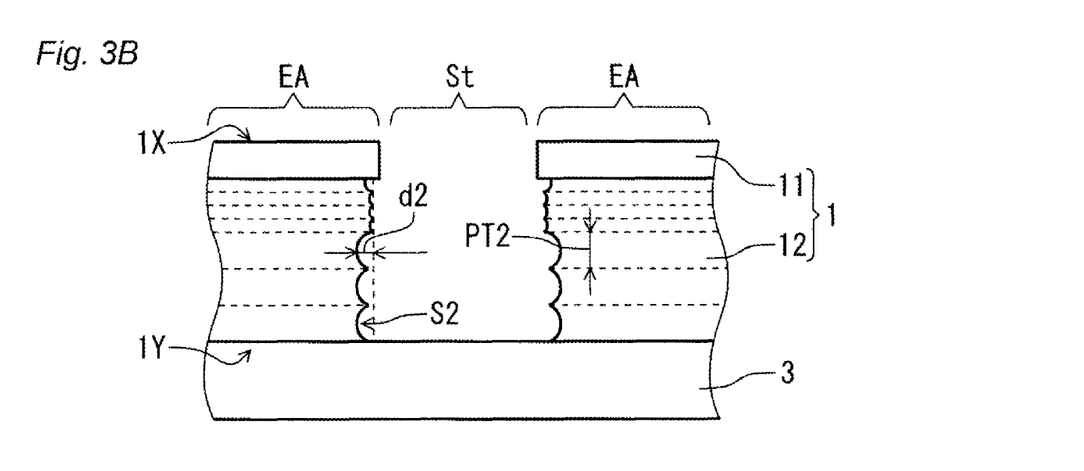

With reference to FIGS. 1-3, a manufacturing process of the element chips according to the embodiment of the present invention will be described hereinafter. FIG. 1A is a top plan view schematically depicting a conveying carrier holding a substrate, and FIG. 1B is a cross-sectional view taken along a B-B line of FIG. 1A. FIG. 2 is a conceptual cross-sectional view depicting a basic structure of a plasma processing apparatus. FIGS. 3A and 3B are side views of the substrate schematically depicting some core steps of the manufacturing process according to the embodiment of the present invention. In the drawings, components having similar functions are referred with similar reference numerals.

[(1) Preparation Step]

Firstly, the substrate 1 to be diced is prepared. The substrate 1 has a first main side 1X and a second main side 1Y, and includes a first layer 11 and a second layer 12 formed of a semiconductor layer to contain the second main side 1Y of the substrate 1. Also, the substrate 1 includes a plurality of streets or street regions St (only one shown in FIGS. 3A and 3B) and a plurality of element regions EA defined by the streets or street regions St. The substrate 1 is etched along the streets St to produce element chips 20 each having the element region EA (see FIG. 4). A circuit layer may be formed in the element region EA, including for example, a semiconductor circuit, an electrical component element, and a MEMS (not shown).

The first layer 11 may include an insulating layer, a wiring metal layer, a resin protective layer such as a polyimide layer, a resist layer, an electrode pad, and a bump. The insulating layer may be formed as a laminate structure (a multi-layered structure) together with the wiring metal layer. The insulating layer contains, for example, the resin layer such as a polyimide layer, a silicon dioxide ($SiO_2$) layer, a silicon nitride ($Si_3N_4$) layer, and a low-k (low-dielectric) layer. The resist layer is arranged on the outer most surface of the first layer 11 which performs a function as a mask in the plasma-dicing step. The resist layer contains a resist material, including for example, a thermosetting resin such as polyimide, a photoresist such as a phenol resin, and a water-soluble resist such as an acrylic resin. The second layer 12 is a semiconductor layer formed of silicon (Si), gallium arsenide (GaAs), gallium nitride (GaN), or silicon carbide (SiC), for example.

The thickness of the first layer 11 is not limited to a particular one, and may be between 2-10 μm, for example. When the first layer 11 includes a second wiring layer and a bump, the thickness thereof may be about 200 μm at most. The thickness of the resist layer is not limited to a particular one, and may be between 5-10 μm, for example. Also, the thickness of the second layer 12 is not limited to a particular one, and may be, for example, between 20-1000 μm or between 100-300 μm. The size of the substrate 1 is not limited to a particular one, and may be between about 50-300 mm, for example. Also, the outline of the substrate 1 is not limited to a particular one, and may be circular or rectangular. Furthermore, the substrate 1 may be provided with an orientation flat and/or a notch (not shown).

For ease of handling the substrate 1, the plasma-dicing step is achieved preferably with the second side 1Y of the substrate 1 being held on a supporting member 3. In this case, a conveying carrier 10 is prepared as well as the substrate 1 in the preparation step.

The supporting member 3 may be made of any material. However, when considering that the substrate 1 is diced while being held on the supporting member 3, it may preferably be formed of flexible resin film to facilitate the diced element chips 20 to be picked up. For ease of handling of the supporting member 3, it is adhered on a frame 2. In the present disclosure, the frame 2 and the supporting member 3 are collectively referred to as a conveying carrier 10 hereinafter.

The material of the resin film is not limited to a particular one, and may be a thermoplastic resin including, for example, polyolefin such as polyethylene and polypropylene and polyester such as polyethylene terephthalate. The resin film may contain various additives including, for example, a rubber component for adding stretching property (for example, ethylene-propylene-diene rubber (EPDM), ethylene-propylene rubber (EPM)), a plasticizer, a softener, an antioxidant, and a conductive material. Also, the thermoplastic resin may contain a functional group exhibiting a photopolymerization reaction such as an acryl group.

The supporting member 3 includes an adhesive side 3a having an adhesive compound and a non-adhesive side 3b having no adhesive compound. The adhesive side 3a has the circumference adhered on the bottom side of the frame 2, and covers the opening of the frame 2. The substrate 1 is adhered on the adhesive side 3a of the supporting member 3 in the opening of the frame 2. During the plasma-dicing step, the supporting member 3 is set on a stage of a chamber (referred to as a vacuum chamber) of a plasma processing apparatus so that the non-adhesive side 3b contacts the stage.

The adhesive side 3a may preferably contain an adhesive material of which adhesibility is weakened with an ultraviolet beam (UV-radiation). This allows each of the element chips 20 produced after the plasma-dicing step to easily be peeled off and picked up from the adhesive side 3a through the UV-radiation. The supporting member 3 may be formed, for example, by applying an UV-curing acrylic adhesive on one side of the resin film to have a thickness of 5-20 μm.

The frame 2 is provided with an opening which has an area equal to or greater than that of the whole substrate 1, a predetermined width, and a substantially constant and small thickness. The frame 2 has a rigidity such that it can be transferred or delivered with the supporting member 3 and the substrate 1 adhered thereon. The shape of the opening of the frame 2 is not limited to a particular one, and may be, for example, circular, rectangular, and polygonal such as hexagonal. The frame 2 may be provided with a notch 2a and/or a corner cut 2b for alignment thereof. The frame 2 may be formed of material including, for example, metal such as aluminum and stainless steel, and a resin.

The conveying carrier 10 is obtained by making the supporting member 3 adhered on one side of the frame 2, while the adhesive side 3a of the supporting member 3 is set so that it faces up to the frame 2 as illustrated in FIG. 1B. Then the second layer 12 of the substrate 1 is adhered on the adhesive side 3a of the supporting member 3 so that the substrate 1 is held on the conveying carrier 10.

[(2) Delivery Step]

Next, the conveying carrier 10 holding the substrate 1 is delivered into the vacuum chamber. Referring to FIG. 2, the plasma processing apparatus 100 used in the plasma-dicing step will be described herein in detail, but it is not limited thereto.

The plasma processing apparatus 100 includes a stage 111, on which the conveying carrier 10 is set so that the adhesive side adhering the substrate 1 faces upwardly. The stage 111 has such a size that the whole conveying carrier 10 can be seated thereon. Arranged over the stage 111 is a cover 124 which overlaps at least a portion of the frame 2 and the supporting member 3 and includes a window 124W exposing at least a portion of the substrate 10. The cover 124 is provided with a plurality of biasing members 107 for biasing the frame 2 downward while the frame 2 is set on the stage 111. Each of the biasing members 107 may preferably be a component for achieving a point contact with the frame 2 such as a coil spring and an elastic resin. This restricts a thermal communication between the frame 2 and the cover 124, and allows correcting a distortion of the frame 2.

The stage 111 and the cover 124 are received within the vacuum chamber 103. The vacuum chamber 103 is shaped in a substantially cylindrical configuration having an opening at the top thereof, and the top opening is closed by a dielectric member 108 formed as a lid of the vacuum chamber 103. The vacuum chamber 103 may be formed of aluminum, stainless steel (SUS), or aluminum with anodic oxide coating, for example. The dielectric member 108 may be formed of yttrium oxide ($Y_2O_3$), aluminum nitride (AlN), alumina ($Al_2O_3$), or quartz ($SiO_2$), for example. Arranged on or above the dielectric member 108 is a top or first electrode 109. The first electrode 109 is electrically connected to a first high-frequency power source 110A. The stage 111 is positioned at the bottom in the vacuum chamber 103.

The vacuum chamber 103 is provided with a gas inlet 103a for introducing a gas and a gas outlet 103b for exhausting the gas. The inlet 103a is configured to be connected selectively to one of a processing gas source (a material gas source for generating a plasma atmosphere) 112 and an ashing gas source 113 each through a conduit. The outlet 103b is connected to a decompressing mechanism 114 having a vacuum pump for exhausting a gas within the vacuum chamber 103 and decompressing it. While the vacuum chamber 103 is supplied with the processing gas, the first electrode 109 is applied with a high-frequency power from the first power source 110A to generate the plasma atmosphere within the vacuum chamber 103.

The stage 111 includes an electrode layer 115, a metal layer 116, and a base member 117 supporting the electrode layer 115 and the metal layer 116, each having a substantially circular shape. The stage 111 also includes a peripheral member 118 surrounding the electrode layer 115, the metal layer 116, and the base member 117. The peripheral member 118 is formed of a metal having a conductivity and an etching resistance for protecting the electrode layer 115, the metal layer 116, and the base member 117 from the plasma exposure. Provided on an upper surface of the peripheral member 118 is an annular circumferential ring 129 for protecting it from the plasma exposure. The electrode layer 115 and the circumferential ring 129 may be formed of the dielectric material as mentioned above.

Arranged within the electrode layer 115 are a first or electrostatic chuck (ESC) electrode 119 and a second electrode 120 connected to a second high-frequency power source 110B. The ESC electrode 119 is electrically connected to a DC power source 126. The electrostatic chucking mechanism is composed of the ESC electrode 119 and the DC power source 126. The supporting member 3 is pulled on and secured to the stage 111 by means of the electrostatic chucking mechanism. Although this embodiment describes the electrostatic chucking mechanism as an example of the securing mechanism for securing the supporting member 3 to the stage 111, the securing mechanism is not limited thereto. Alternatively, a clamp (not shown) may be used as the securing mechanism for securing the supporting member 3 to the stage 111.

The metal layer 116 may be formed of aluminum with an anodic oxidation coating, for example. The metal layer 116 contains a coolant channel 127 configured to cool down the stage 111. Cooling the stage 111 causes the supporting member 3 seated on the stage 111 to be cooled down. Also, the cover 124 whose portion contacts with the stage 111 is also cooled down as well. This protects the substrate 1 and the supporting member 3 from being damaged due to heat applied during the plasma treatment. A coolant in the coolant channel 127 is circulated by a coolant circulation apparatus 125.

Provided around the periphery of the stage 111 is a plurality of supporting rods 122 extending therethrough. Each of the supporting rods 122 supports the frame 2 of the conveying carrier 10. The supporting rods 122 are driven by a lifting mechanism 123A to move upward and downward. The conveying carrier 10 is delivered into the vacuum chamber 103, and passed on the supporting rods 122 which was raised at a given level. Then the supporting rods 122 are lowered with the top surface being flush with or lower than the stage 111, which sets the conveying carrier 10 on the stage 111 at a predetermined position thereof.

Also, a plurality of lifting rods 121 are coupled to the peripheral edge of the cover 124 for moving it upward and downward. The lifting rods 121 are driven by another lifting mechanism 123B. The operation of the lifting mechanisms 123A, 123B are controlled independently each other.

The controller 128 is adapted to control operations of the plasma processing apparatus 100 which includes the first high-frequency power source 110A, the second high-frequency power source 110B, the processing gas source 112, the ashing gas source 113, the decompressing mechanism 114, the coolant circulation apparatus 125, the lifting mechanisms 123A, 123B, and the electrostatic chucking mechanism.

In the delivery step, the cover 124 is raised at a given level by means of the lifting rods 121 in the vacuum chamber 103. The conveying carrier 10 is delivered or loaded within the vacuum chamber 103 while a gate valve (not shown) is open to it. A plurality of the supporting rods 122 are kept at the raised position. When the conveying carrier 10 is delivered to a given position above the stage 111, it is passed onto the supporting rods 122. The conveying carrier 10 is seated on the top end of the supporting rods 122, so that the adhesive side 3a of the supporting member 3 faces upward.

Prior to the delivery step, the first layer 11 in the street regions St may be removed by a laser-scribing step, for example. Alternatively, the first layer 11 in the streets St may be removed by plasma-etching it before a first etching step after the delivery step or a setting step as will be described hereinafter. In this case, the condition for generating the plasma atmosphere to remove the first layer 11 may be different from that of the first etching step. For example, the first layer 11 is removed by plasma exposure with a processing gas material of argon (Ar), and then the condition is switched to the condition used for the Bosch process so as to plasma-etching the second layer 12. In case where the layout of the element regions EA is well designed so that no first layer 11 is originally formed in the streets St, the step of removing the first layer 11 can be eliminated.

[(3) Setting Step]

After the conveying carrier 10 is passed onto the supporting rods 122, the vacuum chamber 103 is closed in a hermetically sealed condition, and the supporting rods 122 are lowered. When the top ends of the supporting rods 122 are lowered to the level same as or lower than the level of the stage 111, the conveying carrier 10 is set on the stage 111. Then the lifting rods 121 are driven to lower the cover 124 to a predetermined level. The distance or gap between the cover 124 and the stage 111 is adjusted so that the each of the biasing members 107 provided on the cover 124 achieves a point contact with the frame 2. Thus, the frame 2 is pushed down by the biasing members 107, and the cover 124 overlaps the frame 2 and a region of the supporting member 3 outside the outer edge of the substrate 1 so that the substrate 1 is exposed by the window 124W of the cover 124. Each of the biasing members 107 may preferably be a component for achieving a point contact with the frame 2 such as a coil spring and an elastic resin. This restricts a thermal communication between the frame 2 and the cover 124, and allows correcting a distortion of the frame 2.

The cover 124 is, for example, doughnut-shaped having a substantial circular outline, and a having a constant width and thickness. The inner diameter of the cover 124 (i.e., a diameter of the window 124) is smaller than the inner diameter of the frame 2, and the outer diameter of the cover 124 is greater than the outer diameter of the frame 2. Therefore, when the conveying carrier 10 is set on the stage at a predetermined position and the cover 124 is lowered, the cover 124 overlaps the frame 2 and at least a partial region of the supporting member 3. Also, at least a portion of the substrate 1 is exposed by the window 124W. The cover 124 may be made of material, including for example, a ceramic such as alumina and aluminum nitride (AlN), a dielectric such as quarts, and a metal such as aluminum with/without an anodic oxidation coating. The biasing members 107 may be made of resin material, besides the aforementioned dielectric and metal.

After the conveying carrier 10 is hand onto the supporting members 122, the ESC electrode 119 is applied with the voltage from the DC power 126. This allows the supporting member 3 stuck on the stage 111 immediately after the supporting member 3 contacts the stage 111. Alternatively, the voltage application to the ESC electrode 119 may be initiated after the supporting member 3 is set on (or contact) the stage 111.

[(4) Plasma-Dicing Step]

The plasma-dicing step of the present embodiment includes first etching steps for etching the second layer 12 along the streets St to form the grooves with first scallops S1 on inner walls at a first pitch PT1, and second etching steps for etching the second layer 12 along the street regions St to form the grooves with second scallops S2 on the inner walls at a second pitch PT2 after the first etching steps. The first and second etching steps are implemented so that the first pitch PT1 of the grooves is less than the second pitch PT2.

With the scallops S1 and S2 formed on the inner walls of the grooves, an imaginary line L may be defined on the bottom surface of the grooves, which is substantially parallel to the first main side ix or the second main side 1Y. The line L can be defined at the boundary between the adjacent scallops S, which is also a ridge line of the convexity characterizing a configuration of the scallops S. The pitch PT of the scallops S can be defined as an averaged gap between the adjacent lines S. When three or more lines L are appeared in the first etching step, the first pitch PT1 can be obtained by averaging the gaps between the adjacent lines S.

The same definition can be applied to the second pitch PT2 as described above and the third pitch PT3 as will be described hereinafter. As discussed above, a scallop S is generally defined as a region between two of the adjacent lines L.

Figure 4:
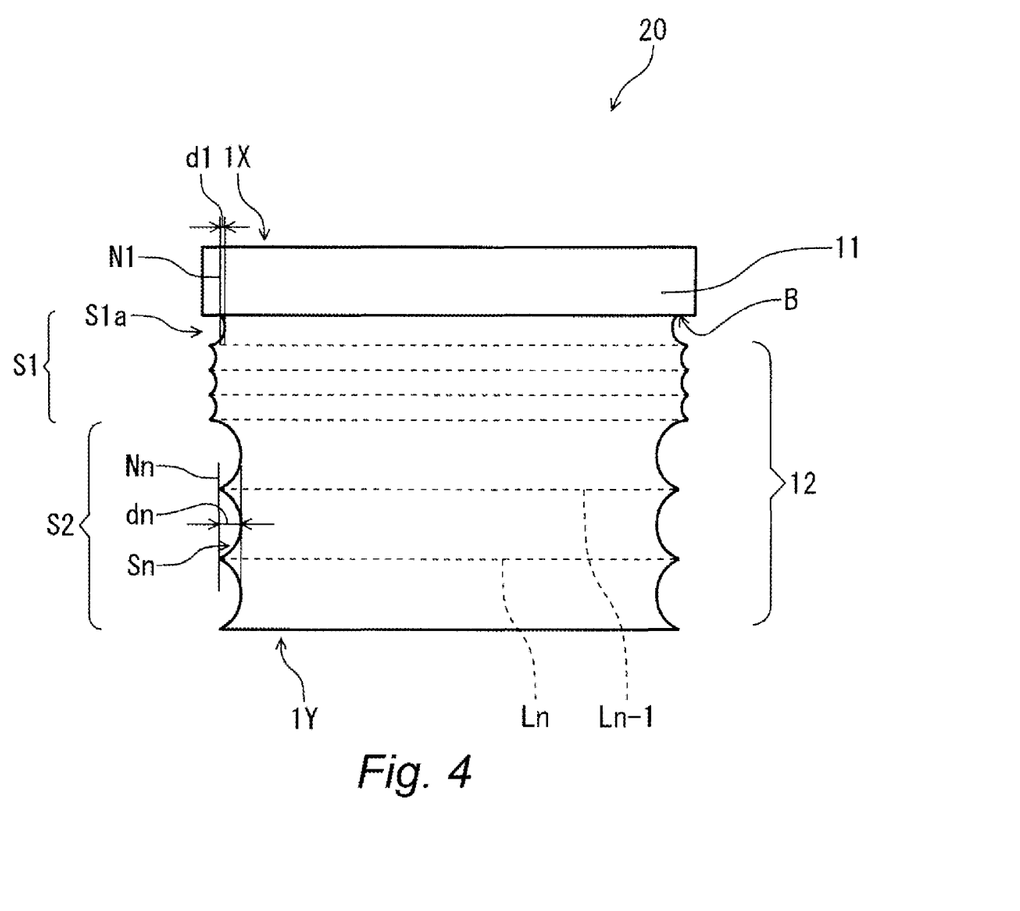
FIG. 4 is a schematic side view of the element chip according to the embodiment of the present invention.

The scallop S has a depth d which can be obtained from the side wall of the element chip 20 corresponding to the inner wall of the groove of the second layer 12. Referring to FIG. 4, the depth d will further be described herein. FIG. 4 is a schematic side view of the element chip 20. The depth d1 is defined as a gap or distance from a normal line N1 extending through a contact point between the scallop S1a and the boundary line B between the first layer 11 and the second layer 12, to the bottom of the concavity of the scallop S1a. In other words, the depth d1 is defined as the maximum distance between the normal line N1 and the surface of the scallop S1a.

The depth dn (n≥2) of the scallop Sn following to the first scallop S1a is defined as a gap or distance from a normal line Nn extending through the contact point between the line $L_{n-1}$ and the scallop Sn, to the bottom of the concavity of the scallop Sn. Thus, the depth dn is defined as the maximum distance between the normal line Nn and the bottom convex surface of the scallop Sn, as illustrated in FIG. 4.

When the scallop S1 is composed of a plurality of sub-scallops, the depth d1 may be calculated by averaging the depths of the sub-scallops. When the scallop S2 as described above and S3 as will be described herein are each composed of a plurality of sub-scallops, the same calculation for the depth d2 and d3 can be applied to the second scallop S2 and the third scallop S3 as well.

A plasma atmosphere is generated as will be described herein. Firstly, a processing gas is introduced from a processing gas source 112 through a gas inlet 103a into the vacuum chamber 103. On the other hand, a decompressing mechanism 114 is used for evacuating the gas within the vacuum chamber 103 to maintain the pressure therein at a constant pressure. Then, the first electrode 109 is applied with the high-frequency power from the high-frequency power source 110A to generate the plasma atmosphere within the vacuum chamber 103. The plasma atmosphere is comprised of ions, electrons, and free radicals. At this time, the second electrode 120 may be applied with the high-frequency power having a high frequency of 100 kHz or more, from the second high-frequency power source 110B. The energy of the ions impinging to the substrate 1 may be controlled by the high-frequency power applied to the second electrode 120 from the second high-frequency power source 110B. The high-frequency power applied to the second electrode 120 defines the biasing potential on the surface of the stage 111, which in turn accelerates the impinging ions towards the substrate 1, thereby to increase the etching rate.

[(4-1) First Etching Routine]

After the aforementioned setting step, as illustrated in FIG. 3A, the second layer 12 is etched by the plasma exposure up to a predetermined depth from the first layer 11 in a first etching routine. The first etching routine is achieved by repeatedly (one or more times) implementing a first etching step for etching the second layer 12 to form the grooves along the streets St, and a first depositing step for depositing the protective film on the inner walls of the grooves. The first etching routine also includes one or more first removing step for removing the protective film between the first depositing step and the first etching step.

Figure 5A:
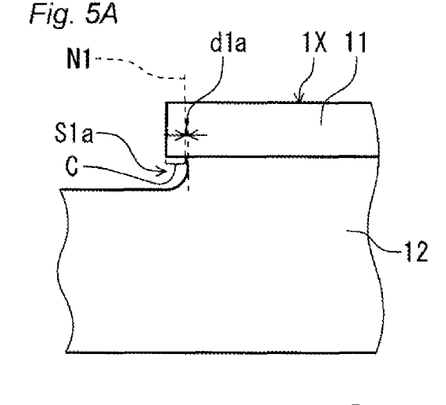
FIGS. 5A-5E are schematic side views of the substrate depicting steps of the first etching routine.
Figure 5B:
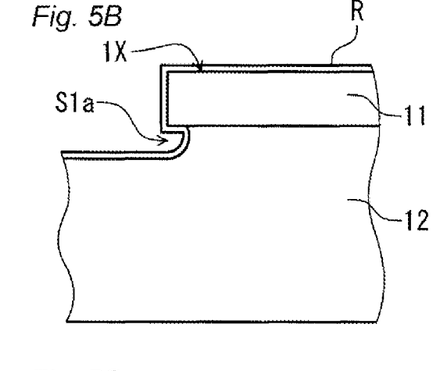

Referring to FIGS. 5A-5E, details of the first etching routine will be described herein, for an exemplary case where the first etching step and the first depositing step are repeated four times (four cycles). FIGS. 5A-5E are schematic side views of the substrate depicting steps in the first etching routine. In FIG. 5A, the first etching step of the first etching routine is initiated to etch the second layer 12 in an isotropic manner, thereby to form the groove accompanying the undercut C beneath the first layer 11 and the first scallop S1a. As will be described in detail hereinafter, since the second layer 12 is etched under a condition such that the pitch PT of the first scallop S1a is reduced, which reduces the undercut C thereof. After the first etching step, as shown in FIG. 5B, the first depositing step is made to form the protective film R on the first side ix and the inner wall of the groove which was formed by partially etching the second layer 12 along the streets St (i.e., the edge surface of the first layer 11 and the exposed surface of the second layer 12).

Figure 5C:
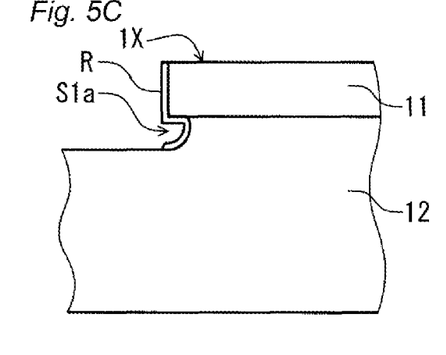

Then, the first removing step for removing the protective layer is made as shown in FIG. 5C. The first removing step includes an isotropic etching step for removing the protective layer R only from the bottom surface of the groove to expose the second layer 12 while leaving the protective layer R on the side wall (i.e., the inner wall of the first scallop S1a).

Figure 5D:
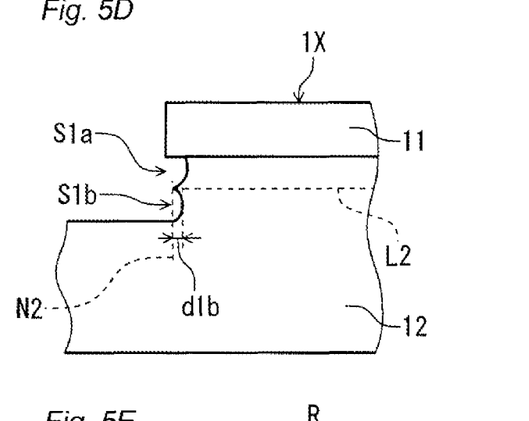
Figure 5E:
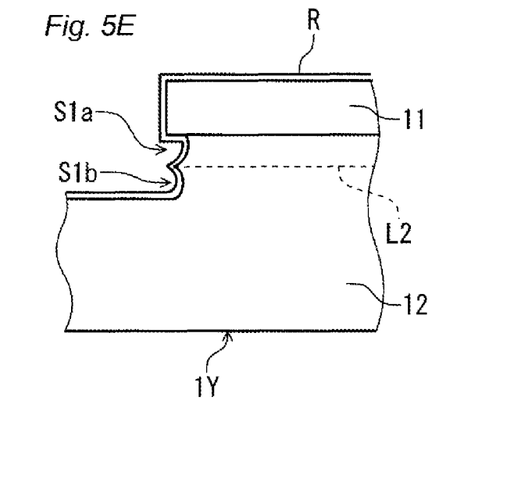

Again, the first etching step is made to etch the second layer 12 at the bottom of the groove in an isotropic manner, thereby to form the second scallop S1b as shown in FIG. 5D. In this case, the second layer 12 is etched with the surface of the first scallop S1a covered by the protective film, so that the undercut C is prevented from expanding in the horizontal direction and the depth d1b of the second scallop S1b is less than that of the undercut C. After the first etching step, as shown in FIG. 5E, the first depositing step is again made to form the protective film R on the first side ix and the inner wall of the groove.

Similarly, after the first etching step and the first depositing step are repeated four times (four cycles) in total, the substrate 1 is etched to have a configuration as depicted in FIG. 3A (with the protective film R omitted). The third and fourth scallops S1 has the depth substantially the same as the depth of the second scallop S1b. Also, as described above, the undercut C is prevented from expanding in the horizontal direction even after repeating the first etching routines.

The conditions in the first etching routine are selected appropriately in accordance with the material of the second layer 12 and the desired pitch PT (first pitch PT1) of the scallop S1. The first pitch PT1 is controlled to be substantially reduced so that the undercut C is also reduced. When a plurality of the scallop S1 are formed, the pitch PT1 may not be constant. However, for reduction of the undercut C, the pitch PT1 in each occasion is preferably less than the pitch PT2 (PT1<PT2).

The etching step in the first etching routine may be implemented under an exemplary condition that while the vacuum chamber is supplied with the source gas of sulfur hexafluoride ($SF_6$) at a rate of 200-400 sccm to have the pressure controlled between 5-25 Pa, the first electrode 109 is applied with power (first high-frequency power P1) of 1500-2500 W from the first high-frequency source 110A, and the second electrode 120 is applied with power of 20-500 W from the second high-frequency source 110B, for the first etching time TE1 of 8-15 seconds.

The depositing step in the first etching routine may be implemented under an exemplary condition that while the vacuum chamber is supplied with the source gas of perfluorocyclobutane ($C_4F_8$) at a rate of 150-250 sccm to have the pressure controlled between 15-25 Pa, the first electrode 109 is applied with power of 1500-5000 W from the first high-frequency source 110A, and the second electrode 120 is applied with power of 0-50 W from the second high-frequency source 110B, for the first depositing time TD1 of 2-10 seconds.

The power applied to the second electrode 120 in the first removing step is controlled to be greater than that in the first etching step, which achieves the isotropic etching of the first removing step. The first removing step may be implemented under an exemplary condition that while the vacuum chamber is supplied with the source gas of sulfur hexafluoride ($SF_6$) at a rate of 200-400 sccm to have the pressure controlled between 5-25 Pa, the first electrode 109 is applied with power (first high-frequency power P1) of 1500-5000 W from the first high-frequency source 110A, and the second electrode 120 is applied with power of 80-800 W from the second high-frequency source 110B, for the removing time of 2-5 seconds.

The first etching routine made under the above-mentioned conditions may achieve etching the second layer 12 at a rate of at 3-12 μm per minute in the vertical direction. The first etching routine may be repeated at least one cycle including the first etching step, the first depositing step and the first removing step, but preferably repeated three or more cycles to suppress the peeling-off between the first layer 11 and the second layer 12. On the other hand, the first etching routine may preferably not be repeated eight or more cycles thereof when taking consideration into the operation time required for production (production yield).

[(4-2) Second Etching Routine]

After the first etching routine, the second etching routine is implemented under conditions different from those of the first etching routine to form the scallops S2 each having a second pitch PT2 greater than the first pitch PT1 (FIG. 3B). The scallops S2 are formed sequentially with and beneath the scallops S1. The second etching routine is achieved by repeatedly (one or more times) implementing a second etching step for etching the second layer 12 to form the grooves along the streets St, and a second depositing step for depositing the protective film on the inner walls of the grooves. The second etching routine also includes one or more second removing step for removing the protective film between the second depositing step and the second etching step.

Details of the second etching routine will be described herein. At the beginning, the second removing step for removing the protective layer is initiated in the second etching routine. The second removing step includes an isotropic etching step for removing the protective layer only from the bottom surface of the groove to expose the second layer 12 while leaving the protective layer on the side wall (i.e., the inner wall of the first scallop S1).

Next, the second etching step is made to isotropically etch the second layer 12 at the bottom of the groove formed in the first etching step, thereby to form the second scallop S2. In this case, the second layer 12 is etched under a condition such that the pitch PT2 of the scallop S2 is greater than the pitch PT1 of the scallop S1 and the depth d2 of the scallop S2 is also greater than the depth d1 of the scallop S1. Meanwhile, the protective film R deposited in the final cycle of the first etching routine still cover the depth d2 of the scallop S2 of the groove, so that the undercut C and the first scallop S1 formed in the first etching routine are prevented from expanding in the horizontal direction and in the depth direction, respectively.

After the second etching step, the second depositing step is again made to form the protective film on the first side ix and the inner wall of the groove which was formed by partially etching the second layer 12 along the streets St (i.e., the edge surface of the first layer 11 and the exposed surface of the second layer 12).

Similarly, after the second etching step and the second depositing step are repeated, the second layer 12 is etched to have a configuration as depicted in FIG. 3B (with the protective film R omitted). Each of the scallops S2 has the depth substantially same as one another. Also, as described above, the undercut C is prevented from expanding in the horizontal direction even after repeating the second etching routines.

The second pitch PT2 of the second scallop S2 is not limited to particular one, as long as it is greater than the first pitch PT1 of the first scallop S1. Especially, when considering issues including the peeling-off between the first layer 11 and the second layer 12 and the operation time required for production (production yield), the first pitch PT1 of the first scallop S1 is preferably equal to or less than a half of the second pitch PT2 of the second scallop S2 (PT1≤½× PT2), and more preferably equal to or less than one-thirds of the second pitch PT2 of the second scallop S2 (PT1≤⅓× PT2). When a plurality of the second scallops S2 are formed, the second pitch PT2 of each of the second scallops S2 may be different from one another, as long as the averaged pitch PT2 is greater than the first pitch PT1, and for example, one of the second scallops S2 may have the pitch less than the first pitch PT1.

The second scallops S2 having the second pitch PT2 greater than the first pitch PT1 (PT1<PT2) may be formed, for example, by controlling the second etching time TE2 for etching the second layer 12 in the second etching routine as being longer than the first etching time TE1 for etching the second layer 12 in the first etching routine (TE1<TE2). Especially, when considering the above-described relationship between the first pitch PT1 and the second pitch PT2, the first etching time TE1 is preferably equal to or less than two-thirds of the second etching time TE2 (TE1≤⅔×TE2), and more preferably equal to or less than a half of the second etching time TE2 (TE1≤½×TE2). Also, a second depositing time TD2 for depositing the protective film 12 in the second etching routine may be controlled as being longer than a depositing time TD1 for depositing the protective film 12 in the first etching routine (TD1<TD2). Especially, the first depositing time TD1 is preferably equal to or less than two-thirds of the second depositing time TD2 (TD1≤⅔× TD2), and more preferably equal to or less than a half of the second depositing time TD2 (TD1≤½×TD2).

For the second etching time TE2 longer than the first etching time TE1, the etching step in the second etching routine may be implemented under an exemplary condition that while the vacuum chamber is supplied with the source gas of sulfur hexafluoride ($SF_6$) at a rate of 200-400 sccm to have the pressure controlled between 5-25 Pa, the first electrode 109 is applied with power (second high-frequency power P2) of 1500-5000 W from the first high-frequency source 110A, and the second electrode 120 is applied with power of 20-500 W from the second high-frequency source 110B, for the second etching time TE2 of 10-25 seconds.

For the second depositing time TD2 longer than the first depositing time TD1, the second depositing step may be implemented under an exemplary condition that while the vacuum chamber is supplied with the source gas of perfluorocyclobutane ($C_4F_8$) at a rate of 150-250 sccm to have the pressure controlled between 15-25 Pa, the first electrode 109 is applied with power of 1500-5000 W from the first high-frequency source 110A, and the second electrode 120 is applied with power of 0-50 W from the second high-frequency source 110B, for the second depositing time TD2 of 3-15 seconds.

The second scallops S2 having the second pitch PT2 greater than the first pitch PT1 (PT1<PT2) may be formed, for example, by controlling the second high-frequency power P2 applied to the first electrode 109 in the second etching routine as being greater than the first high-frequency power P1 applied to the first electrode 109 in the first etching routine (P1<P2). Especially, when considering the above-described relationship between the first pitch PT1 and the second pitch PT2, the first high-frequency power P1 is preferably equal to or less than two-thirds of the second high-frequency power P2 (P1≤⅔×P2), and more preferably equal to or less than a half of the second high-frequency power P2 (P1<½×P2).

For the second high-frequency power P2 greater than the first high-frequency power P1, the etching step in the second etching routine may be implemented under an exemplary condition that while the vacuum chamber is supplied with the source gas of sulfur hexafluoride ($SF_6$) at a rate of 200-400 sccm to have the pressure controlled between 5-25 Pa, the first electrode 109 is applied with power (second high-frequency power P2) of 2500-5000 W from the first high-frequency source 110A, and the second electrode 120 is applied with power of 20-500 W from the second high-frequency source 110B, for the second etching time TE2 of 10-25 seconds. In this instance, the depositing step in the second etching routine is implemented under the condition same as that in the first etching routine.

The power applied to the second electrode 120 in the second removing step is controlled to be greater than that in the second etching step, which achieves the isotropic etching of the second removing step. The second removing step may be implemented under an exemplary condition that while the vacuum chamber is supplied with the source gas of sulfur hexafluoride ($SF_6$) at a rate of 200-400 sccm to have the pressure controlled between 5-25 Pa, the first electrode 109 is applied with power (second high-frequency power P2) of 1500-5000 W from the first high-frequency source 110A, and the second electrode 120 is applied with power of 80-800 W from the second high-frequency source 110B, for the removing time of 2-5 seconds.

The second etching routine made under the above-mentioned conditions may achieve etching the second layer 12 at a rate of at 12-25 μm per minute in the vertical direction. The second etching routine may be repeated at least one cycle including the second etching step, the second depositing step and the second removing step, but preferably ten or less cycles thereof when taking consideration into the operation time required for production (production yield).

[(5) Ashing Step]

An ashing step is implemented after the substrate 1 is individualized into the element chips 20. A processing gas used for the ashing step (for example, oxygen gas (O2) or mixed gas including oxygen gas and gas containing fluorine) is introduced from an ashing gas source 113 into the vacuum chamber 103. On the other hand, the decompressing mechanism 114 is used to evacuate the gas from the vacuum chamber 103 to maintain the pressure therein at a predetermined level. The high-frequency power is applied to the first electrode 109 from the first high-frequency power source 110A to generate the oxygen plasma atmosphere within the vacuum chamber 103, so that the resist layer is thoroughly removed from the surface of the individualized substrate 1 (element chips 20) exposed through the window 124W by the cover 124.

The ashing step may be implemented under an exemplary condition that while the vacuum chamber is supplied with the source gas of mixed gas containing tetrafluoromethane ($CF_4$) and oxygen gas ($O_2$) (e.g., $CF_4:O_2=1:10$) at a rate of 150-300 sccm to have the pressure controlled between 5-15 Pa, the first electrode 109 is applied with power (second high-frequency power P2) of 1500-5000 W from the first high-frequency source 110A, and the second electrode 120 is applied with power of 0-300 W from the second high-frequency source 110B. The power applied to the second electrode 120 in the ashing step is preferably controlled to be less than that in the plasma-dicing step.

[(6) Delivery Step]

After completing the ashing step, the gas in the vacuum chamber 103 is evacuated, and the gate valve is opened. The conveying carrier 10 holding a plurality of the element chips 20 is unloaded from the plasma processing apparatus 100 through the gate valve. The gate valve is closed immediately after the conveying carrier 10 is unloaded. The unloading step of the conveying carrier 10 may be performed by a procedure opposite to the aforementioned loading or delivery step. Thus, the cover 124 is lifted up to the given position, the power supply to the ESC electrode 119 is cut off to release the conveying carrier 10 from the stage 111, and then the supporting rods 122 are moved upward. After the supporting rods 122 are moved up to the given level, the conveying carrier 10 is unloaded from the vacuum chamber 103.

[Element Chips]

The element chip 20 obtained by the manufacturing process of the present embodiment includes the first layer 11 and the second layer 12 as illustrated in FIG. 4, the second layer 12 includes the first scallops S1 at the periphery thereof, which are formed by the first pitch P1 and positioned closer to the first main side 1X and the first layer 11, and the second scallops S2 which are formed by the second pitch P2 and positioned closer to the second main side 1Y. The first pitch PT1 is designed to be less than the second pitch PT2 (PT1<PT2).

The undercut C of the element chip 20 formed between the first layer 11 and the second layer 12 is substantially reduced so that the peeling-off therebetween is also suppressed. Furthermore, since the first layer 11 of the element chip 20 has a size or area which is not much different from that of the second layer 12, the reliability or accuracy for picking up element chip 20 is substantially improved.

Second Embodiment

The plasma-dicing step of the second embodiment is similar to that of the first embodiment except that it includes first, second and third etching routines to etch the substrate from the first side to the second side thereof, thereby to individualize the substrate into element chips. The third etching routine is implemented after the second etching routine, in which a third scallop S3 is formed having a third pitch PT3 less than the second pitch PT2 of the second scallop S2.

This plasma-dicing step is suitable especially when the substrate 1 with the second side 1Y held on the supporting member 3 is secured on the stage 111 by means of the electrostatic chucking mechanism. When the electrical charge is distributed across the substrate 1 in a substantially uniform manner before the substrate 1 is diced into pieces, the electrostatic sticking force between the substrate 1 and the stage 111 is stable. However, as the grooves are deeper (i.e., the second layer 12 is thinner), the electrical charge may locally be distributed in the individual element regions EA in a variable manner. This causes potential difference across the region where the substrate 1 is electrostatically stuck on the stage, which in turn, makes the electrostatic sticking force therebetween unstable. The unstable force may interfere the desired etching performance, thereby to reduce the production yield. Especially, when the second etching routine is used to individualize the substrate 1 into the element chips 20 with a relative high frequency power applied on the first electrode 109, the potential difference across the substrate 1 may be greater as the grooves are deeper (i.e., the second layer 12 is thinner). In the present embodiment, the final approach to dice the substrate 1 is made under a condition such that the third scallop S3 is formed having the third pitch PT3 less than the second pitch PT2 of the second scallop S2 for reducing the potential difference across the substrate 1 while individualizing the substrate 1 into the element chips 20.

Figure 6A:
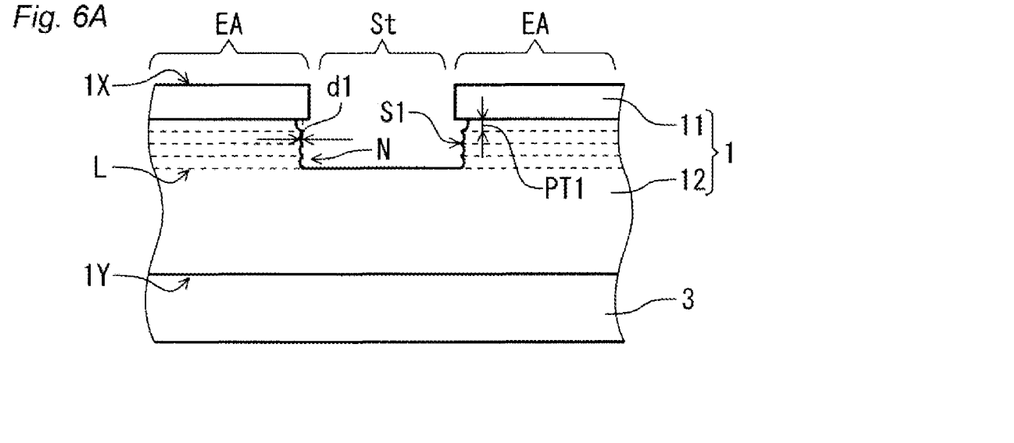
FIGS. 6A-6C are schematic side views of the substrate depicting some core steps of the manufacturing method according to another embodiment of the present invention.
Figure 6B:
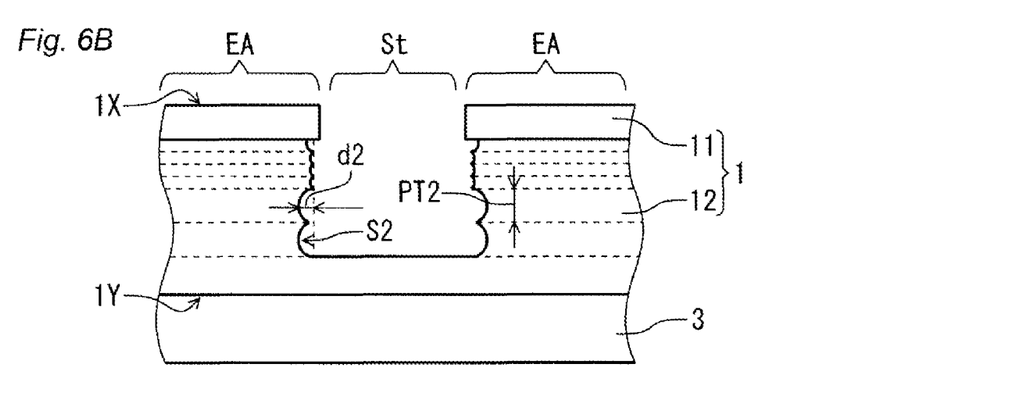

Referring to 6C, the third etching routine of the manufacturing process of the present embodiment will be described hereinafter. FIGS. 6A and 6B correspond to FIGS. 3A and 3B, respectively.

[Third Etching Routine]

Figure 6C:
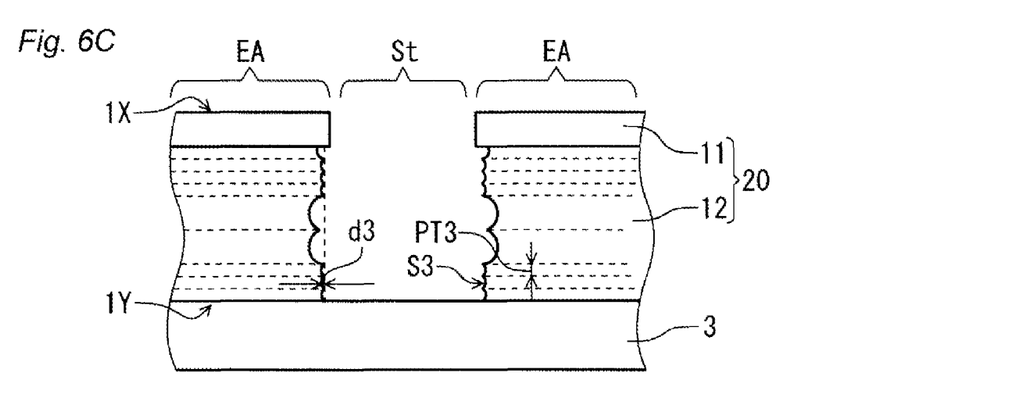

After the second etching routine, the third etching routine is implemented under a condition different from that of the second etching routine so as to form the third scallops S3 having the third pitch PT3 less than the second pitch PT2 of the second scallops S2 (PT3<PT2). The scallops S3 are formed sequentially with and beneath the scallops S2 formed in the second etching routine. The third etching routine is achieved by repeatedly (one or more times) implementing a third etching step for etching the second layer 12 to form the grooves along the streets St, and a third depositing step for depositing the protective film on the inner walls of the grooves. The third etching routine also includes a third removing step for removing the protective film between the third depositing step and the third etching step.

The third pitch PT3 of the third scallop S3 is not limited to particular one, as long as it is less than the second pitch PT2 of the second scallop S2. Especially, when the operation time required for production (production yield), the third pitch PT3 of the third scallop S3 is preferably equal to or less than two-thirds of the second pitch PT2 of the second scallop S2 (PT3≤⅔×PT2), and more preferably equal to or less than a half of the second pitch PT2 of the second scallop S2 (PT3≤½×PT2). When a plurality of the third scallops S3 are formed, the third pitch PT3 of each of the third scallops S3 may be different from one another. However, when considering the stable electrostatic sticking force, the third pitch PT3 of each of the third scallops S3 is preferably less than the second pitch PT2 (PT3<PT2). It should be noted that the relationship between the first pitch PT1 and the third pitch PT3 is not limited to a particular one, and the third pitch PT3 may be equal to (PT1=PT3), less than (PT1>PT3) or greater than the first pitch PT1 (PT1<PT3).

The third scallops S3 having the third pitch PT2 greater than the second pitch PT2 (PT3>PT2) may be formed, for example, by controlling the third etching time TE3 for etching the second layer 12 in the second etching routine as being less than the second etching time TE2 for etching the second layer 12 in the second etching routine (TE3<TE2), or alternatively by controlling the high frequency power P3 applied on the first electrode 109 in the third etching step as being less than the high frequency power P2 applied on the first electrode 109 in the second etching step (P3<P2). Also, to minimize the difference potential, the third etching step is implemented preferably under the condition the high frequency power P3 less than the high frequency power P2. Especially, the third etching step is implemented preferably under the condition the high frequency power P3 being equal to or less than two-thirds of the second pitch PT2 (P3<⅔×P2), and more preferably under the condition the high frequency power P3 being equal to or less than a half of the second pitch PT2 (P3<½×P2).

For the high frequency power P3 being less than high frequency power P2, the etching step in the third etching routine may be implemented under an exemplary condition that while the vacuum chamber is supplied with the source gas of sulfur hexafluoride ($SF_6$) at a rate of 200-400 sccm to have the pressure controlled between 5-25 Pa, the first electrode 109 is applied with power (third high-frequency power P3) of 1250-3500 W from the first high-frequency source 110A, and the second electrode 120 is applied with power of 20-500 W from the second high-frequency source 110B, for the third etching time TE3 of 10-25 seconds. The third deposition step may be made under the same condition of the first deposition step.

The third etching routine made under the above-mentioned conditions may achieve etching the second layer 12 at a rate of at 3-12 μm per minute in the vertical direction. The third etching routine may be repeated at least one cycle including the third etching step, the third depositing step and the third removing step, but preferably three or more cycles thereof when considering the reduction of the difference potential and eight or less cycles thereof when considering the operation time required for production (production yield).

[Element Chip]

Figure 7:
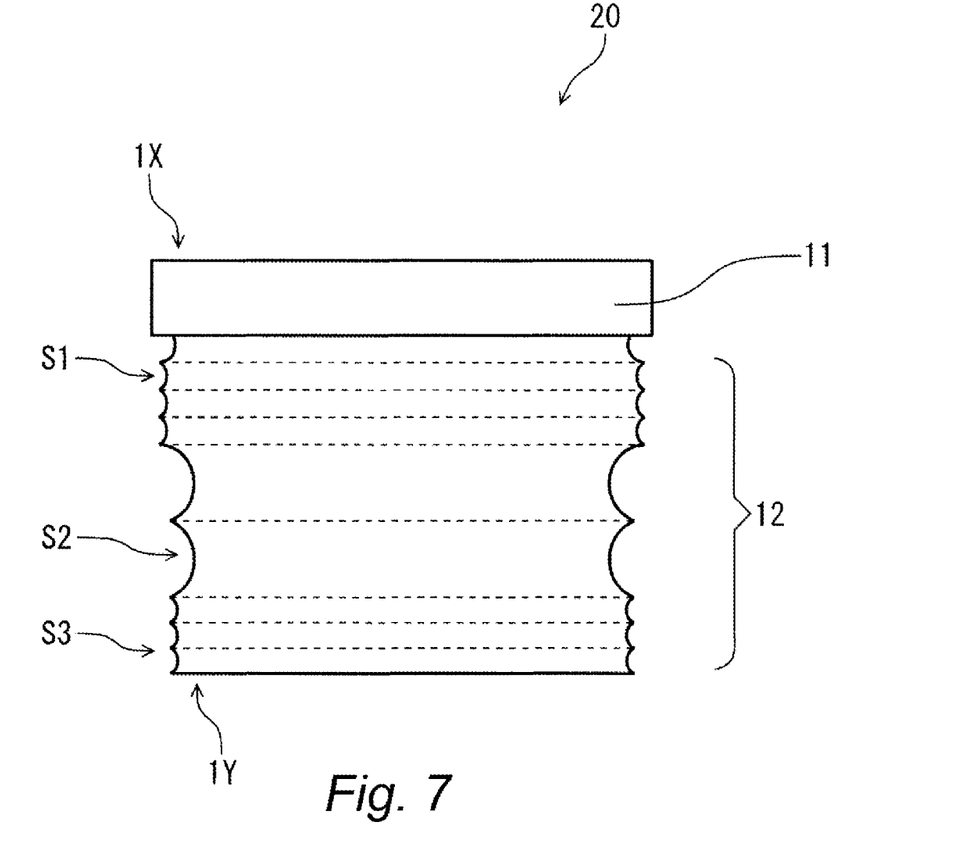
FIG. 7 is a schematic side view of the element chip according to another embodiment of the present invention.

The element chip 20 obtained by the manufacturing process of the present embodiment includes the first layer 11, and the second layer 12 as illustrated in FIG. 7, the second layer 12 has the first scallops S1 at the periphery thereof, which are formed by the first pitch P1 and positioned closer to the first main side 1X and the first layer 11, the third scallops S3 which are formed by the third pitch P3 and positioned closer to the second main side 1Y, and the second scallops S2 which are formed by the second pitch P2 and positioned between the first scallops S1 and third scallops S3. The third pitch PT3 is designed to be less than the second pitch PT2 (PT3<PT2).

The undercut C of the element chip 20 formed between the first layer 11 and the second layer 12 is substantially reduced so that the peeling-off therebetween is also suppressed. Also, since the first layer 11 of the element chip 20 has a size or area which is not much different from that of the second layer 12, the reliability or accuracy for picking up element chip 20 is substantially improved. Furthermore, since the element chip 20 has the reduced concavities and convexities (surface asperity) at the periphery thereof, chipping or cracking of the chip may be avoided due to an external factor. Also, since the element chip 20 has the reduced a pointed tip (convexity) at the periphery at the second side 1Y, chipping or cracking of the chip may further be prevented and particles or debris may be suppressed.

REFERENCE NUMERALS

1: substrate, 1X: first side, 1Y: second side, 10: conveying carrier, 11: first layer, 12: second layer, 2: frame, 2a: notch, 2b: corner cut, 3: supporting member, 3a: adhesive side, 3b: non-adhesive side, 20: element chip, 100: plasma processing apparatus, 103: vacuum chamber, 103a: gas inlet, 103b: gas outlet, 107: biasing member, 108: dielectric member, 109:

first electrode, 110A: first high-frequency power source, 110B: second high-frequency power source, 111: stage, 112: processing gas source, 113: ashing gas source, 114: decompressing mechanism, 115: electrode layer, 116: metal layer, 117: base member, 118: peripheral member, 119: ESC electrode, 220: second electrode, 121: lifting rod, 122: supporting rod, 123A, 123B: lifting mechanism, 124: cover, 124W: window, 125: coolant circulation apparatus, 126: DC power source, 127: coolant channel, 128: controller, 129: circumferential ring, 220: element chip, 201X: first main side, 201Y: second main side, 211: first layer, 212: second layer

What is claimed is:

1. A manufacturing process of an element chip, comprising:
- a preparation step for preparing a substrate having first and second side and including a first layer and a second layer composed of a semiconductor layer closer to the second side than the first layer, the substrate further containing a plurality of street regions defining a plurality of element regions, the first layer having an opening that exposes the second layer at the street regions;
- a setting step for setting the substrate on a stage within a chamber of a plasma processing apparatus with the second side opposing to the stage; and
- a plasma-dicing step for dividing the substrate into a plurality of element chips each having the element region, by exposing the substrate to a plasma atmosphere generated within the chamber by applying a high frequency power to an electrode provided with the plasma processing apparatus;
- wherein the plasma-dicing step is achieved by repeatedly implementing etching routines each including an etching step for etching the second layer along the street regions to form a plurality of grooves and a depositing step for depositing a protective film on edge surfaces of the opening of the first layer and exposed surfaces of the second layer in inner walls of the grooves,
- wherein the plasma-dicing step includes a first etching routine having a first etching step for etching the second layer along the street regions to form the grooves each having a first scallop on the inner wall thereof at a first pitch, and a second etching routine having a second etching step for etching the second layer along the street regions to form the grooves each having a second scallop on the inner wall thereof at a second pitch,
- wherein the second pitch is greater than the first pitch,
- wherein the first layer comprises a resist layer arranged on an outer most surface of the first layer and comprises another layer other than the resist layer, and
- wherein the other layer other than the resist layer includes an insulating layer and a wiring metal layer.

2. The manufacturing process of the element chip according to claim 1, wherein the first etching step is implemented for a first etching time and the second etching step is implemented for a second etching time, and wherein the second etching time is longer than the first etching time.

3. The manufacturing process of the element chip according to claim 1, wherein the first etching step is implemented while applying the electrode with a first high frequency power and the second etching step is implemented while applying the electrode with a second high frequency power, and wherein the second high frequency power is greater than the first high frequency power.

4. The manufacturing process of the element chip according to claim 1, wherein the second side of the substrate is held on the supporting member and the substrate is set on the stage in the setting step by means of an electrostatic chucking mechanism.

5. The manufacturing process of the element chip according to claim 1, wherein the plasma-dicing step includes a third etching routine having a third etching step for etching the second layer along the street regions to form the grooves each having a third scallop on the inner wall thereof at a third pitch, and wherein the second pitch is greater than the third pitch.

6. The manufacturing process of the element chip according to claim 5, wherein the second etching step is implemented while applying the electrode with a second high frequency power and the third etching step is implemented while applying the electrode with a third high frequency power, and wherein the second high frequency power is greater than the third high frequency power.

7. An element chip having first and second side, comprising:
- a first layer containing an element region; and
- a second layer composed of a semiconductor layer closer to the second side than the first layer;
- wherein the second layer includes a periphery having a plurality of scallops formed thereon,
- wherein the scallops include a first scallop formed at a first pitch and a second scallop formed at a second pitch and positioned closer to the second side than the first scallop, and wherein the second pitch is greater than the first pitch.

8. The element chip according to claim 7, wherein the scallops include a third scallop formed at a third pitch and positioned closer to the second side than the second scallop, and wherein the second pitch is greater than the third pitch.

9. The manufacturing process of the element chip according to claim 1, wherein the second etching routine is performed after repeating the first etching routine three or more cycles.

10. The manufacturing process of the element chip according to claim 1, wherein the first etching routine is repeated less than eight cycles.

11. The manufacturing process of the element chip according to claim 1,
- wherein the first scallops each having a substantially same depth are formed by repeating the first etching routine,
- wherein the second scallops each having a substantially same depth are formed by repeating the second etching routine, and
- wherein a depth of each of the second scallops is greater than a depth of each of the first scallops.

12. A manufacturing process of an element chip, comprising:
- a preparation step for preparing a substrate having first and second side and including a first layer and a second layer composed of a semiconductor layer closer to the second side than the first layer, the substrate further containing a plurality of street regions defining a plurality of element regions, the first layer having an opening that exposes the second layer at the street regions;
- a setting step for setting the substrate on a stage within a chamber of a plasma processing apparatus with the second side opposing to the stage; and
- a plasma-dicing step for dividing the substrate into a plurality of element chips each having the element region, by exposing the substrate to a plasma atmosphere generated within the chamber by applying a high frequency power to an electrode provided with the plasma processing apparatus;

wherein the plasma-dicing step is achieved by repeatedly implementing etching routines each including an etching step for etching the second layer along the street regions to form a plurality of grooves and a depositing step for depositing a protective film on edge surfaces of the opening of the first layer and exposed surfaces of the second layer in inner walls of the grooves, wherein the plasma-dicing step includes a first etching routine having a first etching step for etching the second layer along the street regions to form the grooves each having a first scallop on the inner wall thereof at a first pitch, and a second etching routine having a second etching step for etching the second layer along the street regions to form the grooves each having a second scallop on the inner wall thereof at a second pitch, wherein the second pitch is greater than the first pitch, and wherein the first layer comprises an insulating layer, a wiring metal layer, and a resist layer that is arranged on an outer most surface of the first layer.

* * * * *